United States Patent
Nomura et al.

(10) Patent No.: US 11,554,983 B2
(45) Date of Patent: Jan. 17, 2023

(54) GLASS SUBSTRATE, SEMICONDUCTOR DEVICE, AND DISPLAY DEVICE

(71) Applicant: AGC INC., Chiyoda-ku (JP)

(72) Inventors: Shuhei Nomura, Tokyo (JP); Kazutaka Ono, Tokyo (JP)

(73) Assignee: AGC INC., Chiyoda-ku (JP)

( * ) Notice: Subject to any disclaimer, the term of this patent is extended or adjusted under 35 U.S.C. 154(b) by 712 days.

(21) Appl. No.: 16/264,722

(22) Filed: Feb. 1, 2019

(65) Prior Publication Data

US 2019/0161387 A1    May 30, 2019

Related U.S. Application Data

(63) Continuation of application No. PCT/JP2017/027949, filed on Aug. 1, 2017.

(30) Foreign Application Priority Data

Aug. 5, 2016 (JP) .............................. JP2016-154682

(51) Int. Cl.
| | | |
|---|---|---|
| C03C 3/091 | (2006.01) | |
| C03C 4/20 | (2006.01) | |
| H01L 21/02 | (2006.01) | |
| H01L 27/12 | (2006.01) | |
| H01L 29/786 | (2006.01) | |
| G02F 1/1333 | (2006.01) | |
| H01L 21/762 | (2006.01) | |
| H01L 29/66 | (2006.01) | |

(52) U.S. Cl.
CPC ............... *C03C 3/091* (2013.01); *C03C 4/20* (2013.01); *G02F 1/1333* (2013.01); *H01L 21/02* (2013.01); *H01L 21/76251* (2013.01); *H01L 21/76254* (2013.01); *H01L 21/76256* (2013.01); *H01L 27/12* (2013.01); *H01L 27/1218* (2013.01); *H01L 27/1222* (2013.01); *H01L 27/1262* (2013.01); *H01L 29/786* (2013.01); *H01L 29/78654* (2013.01); *C03C 2204/00* (2013.01); *H01L 29/66772* (2013.01)

(58) Field of Classification Search
CPC ......... C03C 3/083; C03C 3/085; C03C 3/087; C03C 3/091; C03C 4/20; C03C 2204/00; G02F 1/1333; H01L 21/02; H01L 21/7602; H01L 21/76254; H01L 27/12; H01L 27/1218; H01L 27/1262; H01L 29/786; H01L 29/78654; H01L 29/66772
See application file for complete search history.

(56) References Cited

U.S. PATENT DOCUMENTS

| | | |
|---|---|---|
| 2003/0090481 A1 | 5/2003 | Kimura |
| 2007/0210720 A1 | 9/2007 | Kimura |
| 2012/0327059 A1 | 12/2012 | Kimura |
| 2013/0228783 A1 | 9/2013 | Kimura |
| 2014/0377525 A1 | 12/2014 | Kawaguchi et al. |
| 2017/0217826 A1 | 8/2017 | Ono et al. |
| 2018/0138215 A1 | 5/2018 | Kimura |

FOREIGN PATENT DOCUMENTS

| | | | | |
|---|---|---|---|---|
| CN | 103429547 A | * | 12/2013 | ............. C03C 3/091 |
| CN | 103429547 A | | 12/2013 | |
| CN | 104039727 A | | 9/2014 | |
| CN | 105271722 A | * | 1/2016 | |
| CN | 105271722 A | | 1/2016 | |
| JP | 2007-220749 | | 8/2007 | |
| JP | 2012-123405 | | 6/2012 | |
| WO | WO 2012/132328 A1 | | 10/2012 | |
| WO | WO-2012132328 A1 | * | 10/2012 | ............. C03C 3/091 |
| WO | WO 2016/063981 A1 | | 4/2016 | |

OTHER PUBLICATIONS

International Search Report dated Sep. 12, 2017 in PCT/JP2017/027949 filed on Aug. 1, 2017 (with English Translation).
Written Opinion dated Sep. 12, 2017 in PCT/JP2017/027949 filed on Aug. 1, 2017 (with English Translation).

* cited by examiner

*Primary Examiner* — Elizabeth A. Bolden
(74) *Attorney, Agent, or Firm* — Oblon, McClelland, Maier & Neustadt, L.L.P.

(57) ABSTRACT

A glass substrate has a compaction of 0.1 to 100 ppm. An absolute value $|\Delta\alpha_{50/100}|$ of a difference between an average coefficient of thermal expansion $\alpha_{50/100}$ of the glass substrate and an average coefficient of thermal expansion of single-crystal silicon at 50° C. to 100° C., an absolute value $|\Delta\alpha_{100/200}|$ of a difference between an average coefficient of thermal expansion $\alpha_{100/200}$ of the glass substrate and an average coefficient of thermal expansion of the single-crystal silicon at 100° C. to 200° C., and an absolute value $|\Delta\alpha_{200/300}|$ of a difference between an average coefficient of thermal expansion $\alpha_{200/300}$ of the glass substrate and an average coefficient of thermal expansion of the single-crystal silicon at 200° C. to 300° C. are 0.16 ppm/° C. or less.

23 Claims, 2 Drawing Sheets

GLASS SUBSTRATE, SEMICONDUCTOR DEVICE, AND DISPLAY DEVICE

TECHNICAL FIELD

The present invention relates to a glass substrate, a semiconductor device, and a display device.

BACKGROUND ART

In recent years, video technology such as VR (Virtual Reality) or AR (Augmented Reality) has been developed, and the market in this field is expected to expand in the future. At the same time, it is requested to achieve higher resolution in a display device in order to obtain a higher sense of immersion in a video image. However, a display device such as an eyepiece display (near-eye display) generally used in this field has an extremely small display size. Therefore, in order to obtain an ultrahigh-definition display, it is expected to require very high image resolution, for example, a value of 1,000 ppi, 2,000 ppi or higher.

However, with miniaturization of a TFT (Thin-Film Transistor) element, there is a problem that a problem of a variation in TFT performance is caused by a problem of a grain boundary in LTPS (Low-Temperature Poly-Silicon) used in the background art. On the other hand, amorphous silicon having no grain boundary has a problem that the mobility is low. In the present situation, it is difficult to put amorphous silicon into practical use.

In consideration of the aforementioned circumstances, there is a technique in which a control TFT is formed on a single-crystal silicon wafer, and laminated to a glass substrate, and only a device part is then separated and transferred to the glass substrate. According to this method, since single-crystal silicon is used for TFT, it is possible to solve the problem as to the low mobility and the variation in TFT properties.

CITATION LIST

Patent Literature

Patent Literature 1: JP-A-2007-220749

SUMMARY OF THE INVENTION

Problem that the Invention is to Solve

Such an ultrahigh-definition display is manufactured through various processes such as a step of laminating a glass substrate and a silicon wafer on each other under a temperature of about 200-700° C., a step of performing heat treatment (such as activation heat treatment) after the laminating step, a step of performing chemical treatment, and a step of forming a display element after forming a TFT. Alkali-free glass is required in this method. However, use of alkali-free glass in the background art causes problems. For example, the glass warps due to a difference in coefficient of thermal expansion between the glass and the silicon wafer when the both are laminated to each other; a pattern deviates due to thermal shrinkage of the glass substrate during the heat treatment; and the glass substrate is clouded by the chemical treatment. No technique that can solve these problems has been implemented.

One embodiment of the invention provides a glass substrate suitable for manufacturing a small-size and high-definition display device, and also provides a semiconductor device and a display device in which the glass substrate has been laminated.

Means for Solving the Problem

A glass substrate according to one embodiment of the invention is a glass substrate having a compaction of 0.1 to 100 ppm, wherein an absolute value $|\Delta\alpha_{50/100}|$ of a difference between an average coefficient of thermal expansion $\alpha_{50/100}$ of the glass substrate and an average coefficient of thermal expansion of single-crystal silicon at 50° C. to 100° C., an absolute value $|\Delta\alpha_{100/200}|$ of a difference between an average coefficient of thermal expansion $\alpha_{100/200}$ of the glass substrate and an average coefficient of thermal expansion of the single-crystal silicon at 100° C. to 200° C., and an absolute value $|\Delta\alpha_{200/300}|$ of a difference between an average coefficient of thermal expansion $\alpha_{200/300}$ of the glass substrate and an average coefficient of thermal expansion of the single-crystal silicon at 200° C. to 300° C. are 0.16 ppm/° C. or less.

A semiconductor device according to one embodiment of the invention includes a glass substrate, and a thin film transistor having a crystalline silicon film formed on the glass substrate. In addition, a display device according to one embodiment of the invention includes a semiconductor device and a display element.

Advantage of the Invention

According to one embodiment of the invention, a glass substrate suitable for manufacturing a semiconductor device and a display device can be provided.

BRIEF DESCRIPTION OF THE DRAWINGS

FIG. 1A to FIG. 1D show a glass substrate according to an embodiment of the invention, which is to be laminated to a silicon substrate.

MODE FOR CARRYING OUT THE INVENTION

Embodiments of the invention will be described below. In the present description, the content of each component in a glass substrate and a method for manufacturing the same is represented by molar percentage based on oxides. In addition, in this description, the expression "-" indicating a numerical range is used in the sense to include the numerical values described before and after the expression as the lower limit and the upper limit, as long as not explained otherwise.

Figure 1A:
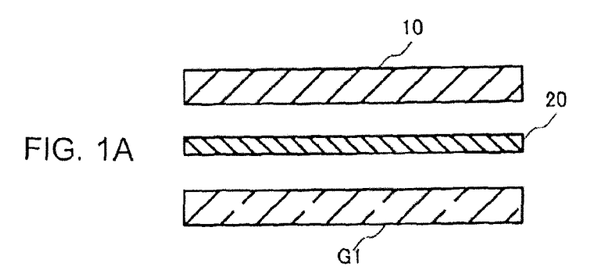
FIG. 1A is a sectional view before the laminating.
Figure 1B:
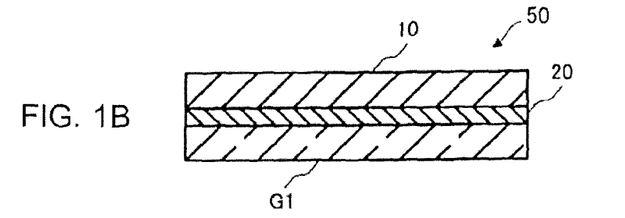
FIG. 1B is a sectional view of a laminated substrate obtained after the laminating.

FIG. 1A to FIG. 1B are views showing a process for manufacturing a semiconductor device and a display device using a glass substrate according to an embodiment of the invention. A glass substrate G1 according to the embodiment of the invention shown in FIG. 1A is laminated to a silicon substrate 10, for example, at a temperature of 200° C.-700° C. Thus, a laminated substrate 50 shown in FIG. 1B is obtained. A single-crystal silicon substrate is preferred as the silicon substrate 10. For example, a full-scale silicon wafer can be used.

The glass substrate G1 and the silicon substrate 10 may be laminated directly, or may be laminated via a bonding layer 20.

The bonding layer 20 is not limited particularly, as long as it is durable to the temperature of 200° C.-700° C. For example, the bonding layer 20 may be formed out of resin, may be formed out of an inorganic insulating layer, or may be forming out of an organic insulating layer. The bonding layer 20 may include a single layer or may include a plurality of layers.

In addition, when the silicon substrate 10 is a single-crystal silicon substrate, a TFT (Thin Film Transistor) having a single-crystal silicon film has been forming in a surface of the silicon substrate 10 which should be laminated to the glass substrate G1. When the silicon substrate 10 is laminated to the glass substrate G1, the thin film transistor is transferred onto the glass substrate G1. When the silicon substrate 10 is a single-crystal silicon substrate, it can be considered that the thin film transistor having the single-crystal silicon film is transferred onto the glass substrate G1. However, through the step of laminating the silicon substrate 10 on the glass substrate G1 or another step, there is a possibility that the single-crystal silicon film of the thin film transistor may be degenerated to cease the existence as the single-crystal silicon film. Accordingly, the thin film transistor forming on the glass substrate may include a crystalline silicon film categorized in a concept also including polycrystal one.

Figure 1C:
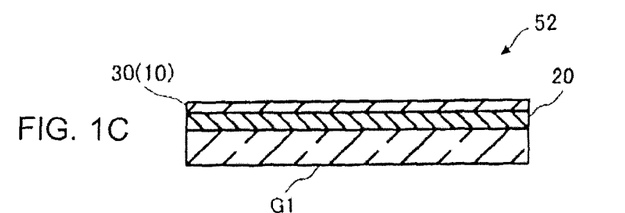
FIG. 1C is a sectional view of a semiconductor device.
Figure 1D:
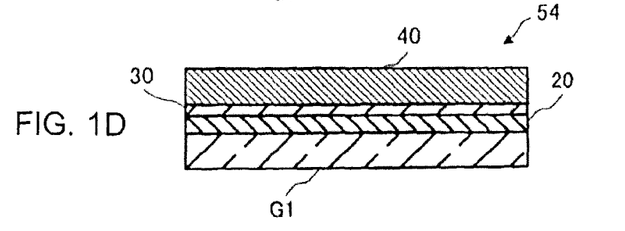
FIG. 1D is a sectional view of a display device.

Next, as shown in FIG. 1C, the silicon substrate 10 of the laminated substrate 50 is formed into a thin film by a predetermined method (for example, formed into a low profile by mechanical grinding/polishing or chemical etching, or formed into a low profile by a smart cut method). On this occasion, since the thin film transistor has been transferred from the glass substrate G1 in the step of FIG. 1A and FIG. 1B, a semiconductor device 52 including a TFT (Thin Film Transistor) 30 having the single-crystal silicon film formed (transferred) on the glass substrate G1 is formed. After that, a predetermined heat treatment and a chemical treatment using BHF (Buffered Hydrogen Fluoride) are performed. Finally as shown in FIG. 1D, a display element 40 including a functional part for reflecting an image or a video, such as a display cell, is laminated (formed) on the semiconductor device 52. Thus, a display device 54 is forming. A liquid crystal display element or the like can be used as the display element 40. In order to obtain a small-size and ultrahigh-definition display, it is preferable to use a self-luminous OLED (Organic Light Emitting Diode) element not requiring a backlight. The display element 40 may be laminated on the glass substrate G1 on the opposite side to the side shown in FIG. 1D.

Figure 2:
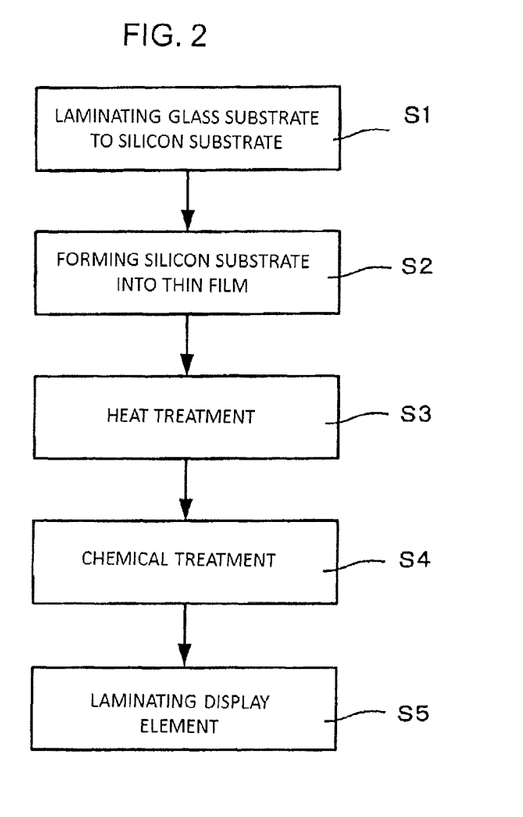
FIG. 2 is a flow chart showing a manufacturing process for manufacturing a semiconductor device and a display device using a glass substrate according to the invention.

FIG. 2 is a flow chart showing the manufacturing process. The silicon substrate 10 and the glass substrate G1 are laminated to each other (Step S1; corresponding to FIG. 1A). The silicon substrate 10 is formed into a thin film by a method such as polishing (Step S2; corresponding to FIG. 1C). After that, the semiconductor device 52 is completed through the heat treatment (Step S3) and the chemical treatment (Step S4). Then the display element 40 is laminated on the semiconductor device 52 to complete the display device 54 (Step S5; corresponding to FIG. 1D). Typically to complete the display device, a step such as patterning is performed between Step S2 and Step S5. Description thereof is omitted for convenience sake.

The following problems have been submitted in the respective steps.

Step S1: Warping occurs due to a residual strain caused by a difference in CTE (Coefficient of Thermal Expansion) between the glass substrate and the silicon substrate.

Step S3: A pattern deviates in the thin film transistor due to thermal shrinkage of the glass substrate (For example, relative to an original drawing of the pattern designed on the basis of the size of the glass substrate before the heat treatment, the glass substrate flowing in the step may be contracted by the heat treatment. Therefore, when patterning is performed following the original drawing in a subsequent step, the pattern deviates. The patterning step in the subsequent step includes an exposure step, a deposition step, a printing step, etc.).

Step 4: The glass substrate is clouded.

As for the problem in Step S1, the glass substrate according to one embodiment of the invention has a small difference in coefficient of thermal expansion from the silicon substrate. It is therefore possible to suppress occurrence of a residual strain and warping caused by the difference in coefficient of thermal expansion in the heat treatment step where the glass substrate is laminated to the silicon substrate or in a subsequent heat treatment step.

As for the problem in Step S3, the glass substrate according to one embodiment of the invention has less compaction, that is, less thermal shrinkage. It is therefore possible to suppress pattern deviation in a subsequent step.

As for the problem in Step S4, the glass substrate according to one embodiment of the invention is hardly clouded so that light transmittance can be secured.

From the aforementioned characteristics, the glass substrate according to each embodiment of the invention is suitable as a glass substrate for a miniaturized high-definition display device. Particularly, the glass substrate according to each embodiment of the invention can be suitably used in a display device having an extremely small size such as an eyepiece display (near-eye display), and a semiconductor device for driving the display device.

In the glass substrate according to one embodiment of the invention, an absolute value $|\Delta\alpha_{50/100}|$ of a difference between an average coefficient of thermal expansion $\alpha_{50/100}$ of the glass substrate and an average coefficient of thermal expansion of single-crystal silicon at 50-100° C., an absolute value Memo/zoo' of a difference between an average coefficient of thermal expansion $\alpha_{100/200}$ of the glass substrate and an average coefficient of thermal expansion of the single-crystal silicon at 100-200° C., and an absolute value $|\Delta\alpha_{200/300}|$ of a difference between an average coefficient of thermal expansion $\alpha_{200/300}$ of the glass substrate and an average coefficient of thermal expansion of the single-crystal silicon at 200-300° C. are 0.16 ppm/° C. or less. The values $|\Delta\alpha_{50/100}|$, $|\Delta\alpha_{100/200}|$ and $|\Delta\alpha_{200/300}|$ are preferably 0.15 ppm/° C. or less, more preferably 0.12 ppm/° C. or less, even more preferably 0.10 ppm/° C. or less, and especially preferably 0.08 ppm/° C. or less.

When all the three values $|\Delta\alpha_{50/100}|$, $|\Delta\alpha_{100/200}|$ and $|\Delta\alpha_{200/300}|$ are 0.16 ppm/° C. or less, it is possible to reduce the difference in coefficient of thermal expansion between the glass substrate and the single-crystal silicon, that is, the silicon substrate. On the other hand, although the lower limit of each of the three values is not limited particularly, it may be normally 0.01 ppm/° C. or higher, may be 0.02 ppm/° C. or higher, or may be 0.05 ppm/° C. or higher.

In the glass substrate according to one embodiment of the invention, the average coefficient of thermal expansion $\alpha_{50/100}$ ion at 50° C.-100° C. is preferably 2.70 ppm/° C.-3.20 ppm/° C. The average coefficient of thermal expansion $\alpha_{50/100}$ is preferably 2.80 ppm/° C. or higher, more preferably 2.90 ppm/° C. or higher, even more preferably 2.91 ppm/° C. or higher, and especially preferably 2.92 ppm/° C. or higher. On the other hand, the average coefficient of thermal expansion $\alpha_{50/100}$ is preferably 3.10 ppm/° C. or less, more preferably 3.00 ppm/° C. or less, even more preferably 2.96 ppm/° C. or less, and especially preferably 2.94 ppm/° C. or less.

When the average coefficient of thermal expansion $\alpha_{50/100}$ is within the aforementioned range, the difference in coefficient of thermal expansion between the glass substrate and the silicon substrate is so small that it is possible to secure a process margin while reducing a residual strain generated in the silicon substrate in the heat treatment step where the silicon substrate and the glass substrate are laminated to each other.

Here, the average coefficient of thermal expansion $\alpha_{50/100}$ at 50° C.-100° C. is an average coefficient of thermal expansion determined through a measurement of coefficient of thermal expansion made over the temperature range of 50° C.-100° C. by the method as provided for in JIS R3102 (year 1995).

In the glass substrate according to one embodiment of the invention, the average coefficient of thermal expansion $\alpha_{200/300}$ at 200° C.-300° C. is preferably 3.45 ppm/° C.-3.95 ppm/° C. The average coefficient of thermal expansion $\alpha_{200/300}$ is preferably 3.55 ppm/° C. or higher, more preferably 3.65 ppm/° C. or higher, even more preferably 3.66 ppm/° C. or higher, and especially preferably 3.68 ppm/° C. or higher. On the other hand, the average coefficient of thermal expansion $\alpha_{200/300}$ is preferably 3.85 ppm/° C. or less, more preferably 3.75 ppm/° C. or less, even more preferably 3.73 ppm/° C. or less, and especially preferably 3.71 ppm/° C. or less.

When the average coefficient of thermal expansion $\alpha_{200/300}$ is within the aforementioned range, it is possible to reduce the difference in coefficient of thermal expansion between the glass substrate and the silicon substrate while securing a process margin when the glass substrate is laminated to the silicon substrate. It is therefore possible to significantly suppress a failure such as a residual strain caused by the difference in coefficient of thermal expansion between the glass substrate and the silicon substrate.

In addition, when the average coefficient of thermal expansion $\alpha_{200/300}$ is within the range of 3.55 ppm/° C.-3.85 ppm/° C., the difference in coefficient of thermal expansion between the glass substrate and the silicon substrate can be reduced sufficiently. It is therefore possible to further suppress the failure caused by the difference in coefficient of thermal expansion.

Here, the average coefficient of thermal expansion $\alpha_{200/300}$ at 200° C.-300° C. is an average coefficient of thermal expansion determined through a measurement of coefficient of thermal expansion made over the temperature range of 200° C.-300° C. by the method as provided for in JIS R3102 (year 1995).

In the glass substrate according to one embodiment of the invention, a value $\alpha_{200/300}/\alpha_{50/100}$ obtained by dividing the average coefficient of thermal expansion $\alpha_{200/300}$ at 200° C.-300° C. by the average coefficient of thermal expansion $\alpha_{50/100}$ at 50° C.-100° C. is preferably 1.10-1.30. When the value $\alpha_{200/300}/\alpha_{50/100}$ is 1.10-1.30, the residual strain generated in the silicon substrate in the heat treatment step where the silicon substrate and the glass substrate are laminated to each other can be reduced due to the small difference in coefficient of thermal expansion between the glass substrate and the silicon substrate. The value $\alpha_{200/300}/\alpha_{50/100}$ is preferably 1.18-1.29, more preferably 1.20-1.28, and especially preferably 1.24-1.27. The value $\alpha_{200/300}/\alpha_{50/100}$ may be 1.16 or more and less than 1.20.

The glass substrate according to one embodiment of the invention has compaction of 0.1-100 ppm. The compaction may be 0.5 ppm or higher, may be 1 ppm or higher, or may be 10 ppm or higher. On the other hand, the compaction is preferably 80 ppm or less, more preferably 60 ppm or less, even more preferably 50 ppm or less, and especially preferably 40 ppm or less.

The compaction is an index indicating thermal shrinkage under a heat treatment in a temperature range lower than the glass transition temperature. When a rate in a slow cooling step which will be described later is suppressed, low compaction can be obtained. When the compaction is within the aforementioned range, it is possible to suppress pattern deviation caused by the heat treatment.

The aforementioned compaction is a glass thermal shrinkage generated by relaxation of a glass structure during a heating treatment. Assume the compaction in the invention as follows. Two indentations are made at a predetermined interval in a surface of the glass substrate. After that, the glass substrate is heated from a room temperature to 600° C. at a rate of 100° C./hour, kept at 600° C. for 80 minutes, and then cooled down to the room temperature at a rate of 100° C./hour. The compaction in the invention means a shrinkage (ppm) of the interval between the indentations in this case.

The compaction in the invention can be measured by the following method.

The surface of the glass substrate is polished to obtain a sample measuring 100 mm×20 mm. Dot-like indentations are made at two places and at an interval A (A=95 mm) in the longitudinal direction of the surface of the sample.

Next the sample is heated from the room temperature to 600° C. at the temperature rising rate of 100° C./hour (=1.6° C./minute), and kept at 600° C. for 80 minutes. The sample is then cooled down to the room temperature at the temperature falling rate of 100° C./hour. The interval between the indentations is measured again. The measured interval is set as B. From the intervals A and B obtained thus, the compaction is calculated using the following expression. The intervals A and B are measured by use of an optical microscope.

$$\text{compaction[ppm]}=(A-B)/A\times10^6$$

In the glass substrate according to one embodiment of the invention, a haze at the time of BHF treatment (hereinafter also referred to as BPIF haze) is preferably 40% or less. The haze is preferably 35% or less, more preferably 30% or less, even more preferably 25% or less, and especially preferably 20% or less.

The haze is an index about transparency of the glass substrate. When the haze is within the aforementioned range, the glass substrate is suppressed from being clouded in the chemical treatment, so that light transmittance can be secured.

The BHF haze in the invention is a ratio of light scattered by cloudiness of glass as follows. The glass is immersed in a solution in which 50 mass % hydrofluoric acid and 40 mass % ammonium fluoride aqueous solution have been mixed at 1:9 (volume ratio), at 25° C. for 20 minutes, then washed and dried. After that, the glass is exposed to light. The BHF haze is a ratio of the light scattered by cloudiness of the glass on this occasion. The haze value is measured by a haze meter manufactured by Suga Test Instruments Co., Ltd.

The glass substrate according to one embodiment of the invention is a so-called alkali-free glass substrate in which the content of alkali metal oxides has been suppressed. The content of alkali metal oxides is preferably 0%-0.1%. Here, the alkali metal oxides include $Li_2O$, $Na_2O$, and $K_2O$. When the content of alkali metal oxides is 0.1% or less, alkali ions are hardly dispersed in the silicon substrate in the heat treatment step where the silicon substrate and the glass substrate are laminated to each other. The content of alkali metal oxides is more preferably 0.05% or less, even more preferably 0.03% or less, and especially preferably substantially nil. Here, the phrase "the content of alkali metal oxides is substantially nil" means that no alkali metal oxide is contained, or alkali metal oxides may be contained as impurities which have unavoidably come into the glass substrate during the production.

Preferably the glass substrate according to one embodiment of the invention has the following composition.

$SiO_2$: 50%-75%
$Al_2O_3$: 6%-16%
$B_2O_3$: 0%-15%
$MgO$: 0%-15%
$CaO$: 0%-13%
$SrO$: 0%-11%
$BaO$: 0%-9.5%

$SiO_2$ is a component which forms a network of glass. When the content of $SiO_2$ is 50% or higher, the glass has improved heat resistance, chemical resistance and weatherability. When the content of $SiO_2$ is 75% or less, the glass can be prevented from having too high melt viscosity and can have satisfactory meltability. The content of $SiO_2$ is preferably 60% or higher, and more preferably 65% or higher. On the other hand, the content of $SiO_2$ is preferably 70% or less, more preferably 68% or less, and especially preferably 67% or less.

When the content of $Al_2O_3$ is 6% or higher, the glass has improved weatherability, heat resistance and chemical resistance, and has a higher Young's modulus. In addition, the glass has a higher strain temperature. Thus, the compaction value can be reduced. When the content of $Al_2O_3$ is 16% or less, the glass can be prevented from having too high melt viscosity and can have satisfactory meltability. Thus, the glass is hardly devitrified. The content of $Al_2O_3$ is preferably 8% or higher, more preferably 11% or higher, and especially preferably 12% or higher. On the other hand, the content of $Al_2O_3$ is preferably 14% or less, and more preferably 13.5% or less.

$B_2O_3$ is not an essential component. However, when $B_2O_3$ is contained, the glass can be prevented from having too high melt viscosity and can have satisfactory meltability. Thus, the glass is hardly devitrified. When the content of $B_2O_3$ is 15% or less, the glass transition temperature can be increased to increase its Young's modulus. The content of $B_2O_3$ is preferably 3% or higher, and especially preferably 4% or higher. In order to suppress the compaction value from being too high, the content of $B_2O_3$ is preferably 12% or less, more preferably 10% or less, and especially preferably 6% or less.

$MgO$ is not an essential component. However, when $MgO$ is contained, the glass can be prevented from having too high melt viscosity and can have satisfactory meltability, improved weatherability, and enhanced Young's modulus. When the content of $MgO$ is 15% or less, the glass is hardly devitrified. The content of $MgO$ is preferably 4% or higher, and more preferably 6% or higher. On the other hand, the content of $MgO$ is preferably 10% or less, more preferably 9.5% or less, and even more preferably 9% or less.

$CaO$ is not an essential component. However, when $CaO$ is contained, the glass can be prevented from having too high melt viscosity and can have satisfactory meltability, and improved weatherability. When the content of $CaO$ is 13% or less, the glass is hardly devitrified. The content of $CaO$ is preferably 1% or higher, more preferably 2% or higher, and especially preferably 4% or higher. On the other hand, the content of $CaO$ is preferably 10% or less, more preferably 8% or less, and especially preferably 7% or less.

$SrO$ is not an essential component. However, when $SrO$ is contained, the glass can be prevented from having too high melt viscosity and can have satisfactory meltability, and improved weatherability. When the content of $SrO$ is 11% or less, the glass is hardly devitrified. The content of $SrO$ is preferably 0.5% or higher, and more preferably 1% or higher. On the other hand, the content of $SrO$ is preferably 8% or less, more preferably 6% or less, and even more preferably 3% or less.

$BaO$ is not an essential component. However, when $BaO$ is contained, the glass can be prevented from having too high melt viscosity and can have satisfactory meltability, and improved weatherability. When the content of $BaO$ is 9.5% or less, the glass is hardly devitrified. The content of $BaO$ is preferably 3% or less, more preferably 2% or less, and especially preferably 0.5% or less.

In the glass substrate according to one embodiment of the invention, the total content of $CaO$, $SrO$, and $BaO$ is preferably 5% or higher. When the total content of $CaO$, $SrO$, and $BaO$ is 5% or higher, the glass is hardly devitrified. The total content of $CaO$, $SrO$, and $BaO$ is preferably 6% or higher, more preferably 7% or higher, and even more preferably 7.5% or higher. On the other hand, the total content of $CaO$, $SrO$, and $BaO$ may be 15% or less, may be 10% or less, or may be 9% or less.

In the glass substrate according to one embodiment of the invention, it is preferable that a relation of (content of $Al_2O_3$)≥(content of $MgO$) is satisfied. When the relation of (content of $Al_2O_3$)≥(content of $MgO$) is satisfied, the average coefficient of thermal expansion of the glass substrate can be easily matched with the average coefficient of thermal expansion of the silicon substrate. Thus, it is possible to reduce the residual strain generated in the silicon substrate in the heat treatment step where the silicon substrate and the glass substrate are laminated to each other.

The glass substrate according to one embodiment of the invention preferably has a devitrification viscosity ($\eta_{TL}$) of $10^{3.8}$ dPa·s or higher. When the devitrification viscosity is $10^{3.8}$ d·Pa·s or higher, the glass substrate can be formed stably. The devitrification viscosity is more preferably $10^{3.9}$ d·Pa·s or higher, and even more preferably $10^{4.02}$ dPa·s or higher.

In the glass substrate according to one embodiment of the invention, the content of $Fe_2O_3$ is preferably 0.01% or less in order to make it difficult for the glass substrate to absorb visible light when the glass substrate is, for example, used as a substrate of a device for displaying an image or a video. The content of $Fe_2O_3$ is more preferably 0.006% or less, and even more preferably 0.004% or less.

Preferably the glass substrate according one embodiment of the invention has a content of $Fe_2O_3$ higher than 0.001% and 0.04% or less in order to enhance its thermal conductivity and improve its meltability. When the content of $Fe_2O_3$ is higher than 0.001%, it is possible to enhance the thermal conductivity of the glass substrate and improve the meltability thereof. When the content of $Fe_2O_3$ is 0.04% or less, the glass substrate can be prevented from absorbing visible light too powerfully.

The content of $Fe_2O_3$ is preferably 0.0015% or higher, and more preferably 0.002% or higher. The content of $Fe_2O_3$ is more preferably 0.035% or less, even more preferably 0.03% or less, and especially preferably 0.025% or less.

The glass substrate according to one embodiment of the invention may contain a refining agent such as $SnO_2$, $SO_3$, Cl, and F.

The glass substrate according to one embodiment of the invention may contain, for example, ZnO, $Li_2O$, $WO_3$, $Nb_2O_5$, $V_2O_5$, $Bi_2O_3$, $MoO_3$, $P_2O_5$, $Ga_2O_3$, $I_2O_5$, $In_2O_5$, $Ge_2O_5$ etc. in order to improve weatherability, meltability, devitrification, ultraviolet ray shielding, infrared ray shielding, ultraviolet ray transmittance, infrared ray transmittance, etc.

The glass substrate according to one embodiment of the invention may contain $ZrO_2$, $Y_2O_3$, $La_2O_3$, $TiO_2$, and $SnO_2$ by a total amount of 2% or less, in order to improve the chemical resistance of the glass. The total content of $ZrO_2$, $Y_2O_3$, $La_2O_3$, $TiO_2$, and $SnO_2$ is preferably 1% or less, and more preferably 0.5% or less. Of these, $Y_2O_3$, $La_2O_3$, and $TiO_2$ also contributes to improvement in the Young's modulus of the glass.

The glass substrate according to one embodiment of the invention preferably contains substantially neither $As_2O_3$ nor $Sb_2O_3$ from the standpoint of environmental burden. The glass substrate preferably contains substantially no ZnO from the standpoint of stable formability in a float process.

In the glass substrate according to one embodiment of the invention, the average coefficient of thermal expansion $\alpha_{100/200}$ at 100° C.-200° C. is preferably 3.13 ppm/° C.-3.63 ppm/° C., and more preferably 3.23 ppm/° C.-3.53 ppm/° C. When the average coefficient of thermal expansion $\alpha_{100/200}$ is within the aforementioned range, the difference in coefficient of thermal expansion between the glass substrate and the silicon substrate is so small that it is possible to secure a process margin while reducing the residual strain generated in the silicon substrate in the heat treatment step where the silicon substrate and the glass substrate are laminated to each other.

$\alpha_{100/200}$ is preferably 3.33 ppm/° C. or higher, more preferably 3.34 ppm/° C. or higher, and especially preferably 3.35 ppm/° C. or higher. On the other hand, $\alpha_{100/200}$ is preferably 3.44 ppm/° C. or less, more preferably 3.43 ppm/° C. or less, even more preferably 3.41 ppm/° C. or less, and especially preferably 3.38 ppm/° C. or less.

Here, the average coefficient of thermal expansion $\alpha_{100/200}$ at 100° C.-200° C. is an average coefficient of thermal expansion determined through a measurement of coefficient of thermal expansion made over the temperature range of 100° C.-200° C. by the method as provided for in JIS R3102 (year 1995).

The glass substrate according to one embodiment of the invention has a Young's modulus of 60 GPa or more. When the Young's modulus is 60 GPa or more, the glass substrate can be suppressed from warping or cracking in a slow cooling step when the glass substrate is manufactured. In addition, it is possible to suppress damage of the glass substrate caused by contact with the silicon substrate, a peripheral member, etc. The Young's modulus is more preferably 65 GPa or more, even more preferably 70 GPa or more, and especially preferably 80 GPa or more.

On the other hand, the Young's modulus is preferably 100 GPa or less. When the Young's modulus is preferably 100 GPa or less, the glass can be suppressed from being brittle, and the glass substrate can be inhibited from chipping during cutting or dicing. The Young's modulus thereof is more preferably 90 GPa or less, and even more preferably 87 GPa or less.

The glass substrate according to one embodiment of the invention preferably has a thickness of 1.0 mm or less. When the thickness is 1.0 mm or less, a display device can be formed to be low in profile. The thickness is more preferably 0.8 mm or less, even more preferably 0.7 mm or less, and especially preferably 0.5 mm or less.

On the other hand, the thickness of the glass substrate is preferably 0.05 mm or more. When the thickness is 0.05 mm or more, the glass substrate can be inhibited from being damaged by contact with the silicon substrate, a peripheral member, etc. In addition, the glass substrate can be inhibited from being bent by its own weight. The thickness is more preferably 0.1 mm or more, and even more preferably 0.3 mm or more.

Preferably in the glass substrate according to one embodiment of the invention, one main surface thereof has an area of 0.03 $m^2$ or larger. When the area is 0.03 $m^2$ or larger, the silicon substrate having a large area can be used so that a large number of display devices can be manufactured from one laminated substrate. The area is more preferably 0.04 $m^2$ or larger, and even more preferably 0.05 $m^2$ or larger.

In addition, in the glass substrate according to one embodiment of the invention, the values $|\Delta\alpha_{50/100}|$, $|\Delta\alpha_{100/200}|$ and $|\Delta\alpha_{200/300}|$ are 0.16 ppm/° C. or less. Accordingly, even when the area reaches 0.03 $m^2$ or larger, the residual strain generated in the silicon substrate can be reduced in the heat treatment step where the silicon substrate and the glass substrate are laminated to each other. The area is preferably 0.1 $m^2$ or less. When the area is preferably 0.1 $m^2$ or less, it is easy to handle the glass substrate, so that the glass substrate can be inhibited from being damaged by contact with the silicon substrate, a peripheral member, etc. The area is more preferably 0.08 $m^2$ or less, and even more preferably 0.06 $m^2$ or less.

The glass substrate according to one embodiment of the invention preferably has a density of 2.60 $g/cm^3$ or less. When the density is 2.60 $g/cm^3$ or less, the glass substrate is light in weight. In addition, the glass substrate can be suppressed from being bent by its own weight. The density is more preferably 2.55 $g/cm^3$ or less, even more preferably 2.50 $g/cm^3$ or less, and especially preferably 2.48 $g/cm^3$.

On the other hand, the density is preferably 2.20 $g/cm^3$ or higher. When the density is 2.20 $g/cm^3$ or higher, the glass can have a heightened Vickers hardness. Thus, it is possible to make it difficult to scratch the glass surface. The density is more preferably 2.30 $g/cm^3$ or higher, even more preferably 2.40 $g/cm^3$ or higher, and especially preferably 2.45 $g/cm^3$ or higher.

In the glass substrate according to one embodiment of the invention, a density of defects included in the glass substrate is preferably 1 defect/$cm^2$ or less. The defects included in the glass substrate include bubbles, flaws, metal foreign substances such as platinum, unmelted raw materials, etc. existing in the surface or the inside of the glass substrate, each having a size of 1 mm or smaller and 0.5 μm or larger. A defect larger than 1 mm can be visually determined easily, and a substrate having such a defect can be removed easily. A defect smaller than 0.5 μm is so small that there is less possibility that the defect may affect the characteristics of an element even when the substrate is used as a substrate of an ultrahigh-definition display. In a liquid crystal display device, particularly in a bottom-emission OLED display device, visual recognition is performed from the glass substrate side. Accordingly, high-quality management of defects is required. The density of defects is more preferably 0.1 defect/$cm^2$ or less, and even more preferably 0.01 defect/$cm^2$ or less.

The glass substrate according to one embodiment of the invention is not particularly limited as to the shape thereof. The glass substrate may be circular, elliptical or rectangular, and may have a notch or orientation flat formed in the edge thereof in order to be matched with the shape of the silicon substrate to be laminated thereto. When the glass substrate is circular, some of the periphery of the glass substrate may be straight.

The glass substrate according to one embodiment of the invention preferably has a strain temperature of 650° C. or higher. When the strain temperature is 650° C. or higher, a dimensional change of the glass substrate during the heat treatment step can be suppressed. The strain temperature is preferably 700° C. or higher, more preferably 720° C. or higher, and even more preferably 740° C. or higher.

A manufacturing method for improving a low thermal shrinkage property may be applied to the alkali-free glass in one embodiment of the invention. Specifically, it is preferable that an equivalent cooling rate $q_{eq}$ is made not higher than 400° C./min. Here, the equivalent cooling rate is defined and evaluated in the following manner.

A glass processed into a cube measuring 10 mm×10 mm×0.3 mm–2.0 mm is kept at a temperature higher than its strain temperature by 170° C. for 5 minutes by use of an infrared heating type electric furnace. After that, the glass is cooled down to a room temperature (25° C.). On this occasion, a plurality of glass samples distributed within a range of the cooling rate from 1° C./min to 1,000° C./min are made up.

A refractive index $n_d$ of a d-line (wavelength 587.6 nm) in each of the glass samples is measured by a V-block method using KPR-2000 manufactured by Shimadzu Corporation.

Each refractive index $n_d$ obtained thus is plotted on the logarithm of the cooling rate corresponding thereto. Thus, a calibration curve of $n_d$ on the cooling rate is obtained.

Next, $n_d$ of a glass actually manufactured through steps of melting, forming, cooling, etc. is measured in the aforementioned measurement method. A cooling rate corresponding to the obtained $n_d$ (referred to as equivalent cooling rate in this embodiment) is obtained from the aforementioned calibration curve.

The equivalent cooling rate is preferably 400° C./min or less, more preferably 350° C./min or less, and even more preferably 100° C./min or less. On the other hand, when the equivalent cooling rate is too low, the productivity of the glass substrate deteriorates. Therefore, the equivalent cooling rate is preferably 0.1° C./min or higher, more preferably 1° C./min or higher, and even more preferably 10° C./min or higher.

In the glass substrate according to one embodiment of the invention, a temperature at which the viscosity of the glass substrate reaches $10^2$ dPa·s (also referred to as $T_2$) is preferably 1,800° C. or less. $T_2$ is more preferably 1,750° C. or less, even more preferably 1,700° C. or less, and especially preferably 1,650° C. or less.

In the glass substrate according to one embodiment of the invention, a temperature at which the viscosity of the glass substrate reaches $10^4$ dPa·s (also referred to as $T_4$) is preferably 1,350° C. or less. $T_4$ is more preferably 1,300° C. or less, even more preferably 1,295° C. or less, and especially preferably 1,290° C. or less. In consideration of easiness to secure other properties, $T_4$ is 1,100° C. or higher.

In the glass substrate according to one embodiment of the invention, a devitrification temperature thereof is preferably 1,325° C. or less, more preferably 1,320° C. or less, even more preferably 1,310° C. or less, and especially preferably 1,295° C. or less. A devitrification temperature of a glass is obtained as follows. Crushed particles of the glass are placed on a platinum dish and heat-treated for 17 hours in an electric furnace controlled so as to have a constant temperature. The heat-treated glass is examined with an optical microscope to determine a highest temperature at which crystal precipitation occurs inside the glass and a lowest temperature at which crystal precipitation does not occur inside the glass. The devitrification temperature of the glass is an average value of the highest temperature and the lowest temperature.

The glass substrate according to one embodiment of the invention preferably satisfies:

0.0177×(content of $SiO_2$)−0.0173×(content of $Al_2O_3$)+0.0377×(content of $B_2O_3$)+0.0771×(content of MgO)+0.1543×(content of CaO)+0.1808×(content of SrO)+0.2082×(content of BaO)+0.0344×($\log_{10}q_{eq}$) is 2.70-3.20;

0.0181×(content of $SiO_2$)+0.0004×(content of $Al_2O_3$)+0.0387×(content of $B_2O_3$)+0.0913×(content of MgO)+0.1621×(content of CaO)+0.1900×(content of SrO)+0.2180×(content of BaO)+0.0391×($\log_{10}q_{eq}$) is 3.13-3.63;

0.0177×(content of $SiO_2$)+0.0195×(content of $Al_2O_3$)+0.0323×(content of $B_2O_3$)+0.1015×(content of MgO)+0.1686×(content of CaO)+0.1990×(content of SrO)+0.2179×(content of BaO)+0.0312×($\log_{10}q_{eq}$) is 3.45-3.95; and 0.0111×(content of $SiO_2$)+0.0250×(content of $Al_2O_3$)+0.0078×(content of $B_2O_3$)+0.0144×(content of MgO)+0.0053×(content of CaO)+0.0052×(content of SrO)+0.0013×(content of BaO)−0.0041×($\log_{10}q_{eq}$) is 1.10-1.30.

Here, the content of $SiO_2$, the content of $Al_2O_3$, the content of $B_2O_3$, the content of MgO, the content of CaO, the content of SrO, and the content of BaO are contents of respective components contained in the obtained glass, and $q_{eq}$ is an equivalent cooling rate.

When the glass substrate satisfies those conditions, it is possible to secure a process margin while easily reducing a residual strain generated in the silicon strain in the heat treatment step where the silicon substrate and the glass substrate are laminated to each other.

0.0177×(content of $SiO_2$)−0.0173×(content of $Al_2O_3$)+0.0377×(content of $B_2O_3$)+0.0771×(content of MgO)+0.1543×(content of CaO)+0.1808×(content of SrO)+0.2082×(content of BaO)+0.0344×($\log_{10}q_{eq}$) is preferably 2.80 or more, more preferably 2.90 or more, even more preferably 2.91 or more, and especially preferably 2.92 or more.

On the other hand, 0.0177×(content of $SiO_2$)−0.0173×(content of $Al_2O_3$)+0.0377×(content of $B_2O_3$)+0.0771×(content of MgO)+0.1543×(content of CaO)+0.1808×(content of SrO)+0.2082×(content of BaO)+0.0344×($\log_{10}q_{eq}$) is preferably 3.10 or less, more preferably 3.00 or less, even more preferably 2.96 or less, and especially preferably 2.94 or less.

0.0181×(content of $SiO_2$)+0.0004×(content of $Al_2O_3$)+0.0387×(content of $B_2O_3$)+0.0913×(content of MgO)+0.1621×(content of CaO)+0.1900×(content of SrO)+0.2180×(content of BaO)+0.0391×($\log_{10}q_{eq}$) is preferably 3.23 or more, more preferably 3.33 or more, even more preferably 3.34 or more, and especially preferably 3.35 or more.

On the other hand, 0.0181×(content of $SiO_2$)+0.0004×(content of $Al_2O_3$)+0.0387×(content of $B_2O_3$)+0.0913×(content of MgO)+0.1621×(content of CaO)+0.1900×(content of SrO)+0.2180×(content of BaO)+0.0391×($\log_{10}q_{eq}$) is preferably 3.53 or less, more preferably 3.43 or less, even more preferably 3.41 or less, and especially preferably 3.38 or less.

$0.0177 \times$(content of $SiO_2$)$+0.0195 \times$(content of $Al_2O_3$)$+0.0323 \times$(content of $B_2O_3$)$+0.1015 \times$(content of $MgO$)$+0.1686 \times$(content of $CaO$)$+0.1990 \times$(content of $SrO$)$+0.2179 \times$(content of $BaO$)$+0.0312 \times (\log_{10} q_{eq})$ is preferably 3.55 or more, more preferably 3.65 or more, even more preferably 3.66 or more, and especially preferably 3.68 or more.

On the other hand, $0.0177 \times$(content of $SiO_2$)$+0.0195 \times$(content of $Al_2O_3$)$+0.0323 \times$(content of $B_2O_3$)$+0.1015 \times$(content of $MgO$)$+0.1686 \times$(content of $CaO$)$+0.1990 \times$(content of $SrO$)$+0.2179 \times$(content of $BaO$)$+0.0312 \times (\log_{10} q_{eq})$ is preferably 3.85 or less, more preferably 3.73 or less, even more preferably 3.65 or less, and especially preferably 3.71 or less.

Further, $0.0111 \times$(content of $SiO_2$)$+0.0250 \times$(content of $Al_2O_3$)$+0.0078 \times$(content of $B_2O_3$)$+0.0144 \times$(content of $MgO$)$+0.0053 \times$(content of $CaO$)$+0.0052 \times$(content of $SrO$)$+0.0013 \times$(content of $BaO$)$-0.0041 \times (\log_{10} q_{eq})$ is preferably 1.20 or more.

On the other hand, $0.0111 \times$(content of $SiO_2$)$+0.0250 \times$(content of $Al_2O_3$)$+0.0078 \times$(content of $B_2O_3$)$+0.0144 \times$(content of $MgO$)$+0.0053 \times$(content of $CaO$)$+0.0052 \times$(content of $SrO$)$+0.0013 \times$(content of $BaO$)$-0.0041 \times (\log_{10} q_{eq})$ is preferably 1.27 or less.

In the glass substrate according to one embodiment of the invention, when the glass substrate has a thickness of 0.5 mm, a transmittance of light at a wavelength of 300 nm is preferably 55% or higher, more preferably 60% or higher, even more preferably 70% or higher, and especially preferably 75% or higher. When the transmittance at the wavelength of 300 nm is high, a bonding layer can be separated efficiently by irradiation with ultraviolet rays through the glass surface, or an oriented film can be aligned efficiently when the glass substrate is applied to a liquid crystal display.

In the glass substrate according to one embodiment of the invention, a weight reduction amount in a hydrofluoric acid aqueous solution (HF) (hereinafter also referred to as HF weight reduction amount) is preferably 0.05 (mg/cm$^2$)/min or higher and 0.20 (mg/cm$^2$)/min or less. Here, the HF weight reduction amount is a reduction amount ((mg/cm$^2$)/min) per unit area and unit time when the glass substrate is immersed in a 5 mass % hydrofluoric acid aqueous solution at 25° C.

The glass substrate according to one embodiment of the invention may be installed directly as a part of a device after the glass substrate is laminated to the silicone substrate. For example, the glass substrate is installed as a display substrate in the device. In such a case, it is preferable to slim the glass substrate in order to miniaturize the device. Therefore, in the glass substrate according to one embodiment of the invention, it is more preferable that the slimming rate is higher. The HF weight reduction amount may be used as an index of the slimming rate of the glass substrate.

When the HF weight reduction amount is 0.05 (mg/cm$^2$)/min or higher, the productivity in the slimming step can be improved and thus it is preferable. On the other hand, when the HF weight reduction amount is 0.20 (mg/cm$^2$)/min or less, it is possible to prevent such a failure that smoothness may be lost in the surface of the glass substrate due to unevenness in etching depth and thus it is preferable.

The HF weight reduction amount is more preferably 0.07 (mg/cm')/min or higher, even more preferably 0.09 (mg/cm$^2$)/min or higher, and especially preferably 0.11 (mg/cm$^2$)/min or higher. On the other hand, the HF weight reduction amount is more preferably 0.18 (mg/cm$^2$)/min or less, even more preferably 0.16 (mg/cm$^2$)/min or less, and especially preferably 0.14 (mg/cm$^2$)/min or less.

In the glass substrate according to one embodiment of the invention, a photoelastic constant thereof is preferably 33 nm/(MPa·cm) or less, more preferably 32 nm/(MPa·cm) or less, even more preferably 31 nm/(MPa·cm) or less, especially preferably 30 nm/(MPa·cm) or less, and most preferably 29 nm/(MPa·cm) or less. When the photoelastic constant is 33 nm/(MPa·cm) or less, poor image quality can be prevented from occurring easily in the display device.

The laminated substrate according to one embodiment of the invention is formed by a lamination of the aforementioned glass substrate and a silicon substrate. Due to a small difference in coefficient of thermal expansion between the silicon substrate and the glass substrate, a residual strain generated in the silicon substrate can be reduced in the heat treatment step where the silicon substrate and the glass substrate are laminated to each other. The laminated substrate may be obtained by laminating the glass substrate and the silicon substrate to each other via a resin interposed therebetween.

On this occasion, warping of the laminated substrate as a whole may be affected by the thickness of the resin, the coefficient of thermal expansion of the resin, the heat treatment temperature during the laminating, etc. The laminated substrate according to one embodiment of the invention, the coefficient of thermal expansion can be controlled as in the glass substrate according to one of the aforementioned embodiments of the invention, so that the warping of the laminated substrate as a whole can be reduced. Thus, it is possible to expand a process margin for the thickness of the resin, the coefficient of thermal expansion of the resin, the heat treatment temperature during the laminating, etc. The glass substrate according to one of the aforementioned embodiments of the invention can be applied to the laminated substrate according to one embodiment of the invention.

Next, a method for manufacturing a glass substrate according to one embodiment of the invention will be described.

A glass substrate according to one embodiment of the invention is manufactured though a melting step of heating raw glass materials to obtain molten glass, a refining step of removing bubbles from the molten glass, a forming step of forming the molten glass into a plate-like shape to obtain a glass ribbon, and an slow cooling step of gradually cooling the glass ribbon down to a room temperature state.

In the melting step, raw materials are prepared to have a composition of a glass plate which should be obtained. The raw materials are continuously thrown into a melting furnace, and preferably heated to about 1,450° C.-1,650° C. to obtain molten glass.

Oxides, carbonates, nitrates, hydroxides, halides such as chlorides, etc. can be used as the raw materials. When the melting or refining step includes a step in which the molten glass comes into contact with platinum, fine platinum particles may come into the molten glass and be included as foreign matter in the glass plate obtained. Nitrates used as raw materials has an effect of preventing the platinum from coming into the molten glass as foreign matter.

Strontium nitrate, barium nitrate, magnesium nitrate, calcium nitrate, etc. can be used as the nitrates. It is more preferred to use strontium nitrate. With respect to the particle sizes of the raw materials, various raw materials can be suitably used, ranging from raw materials having a particle diameter of several hundred micrometers that is large enough not to remain unmelted to raw materials having a particle diameter of several micrometers that is small enough neither to fly off during raw-material conveyance nor to aggregate into secondary particles. Granules can be also used. The water contents of the raw materials can be suitably regulated in order to prevent the raw materials from flying off. Melting conditions including β-OH and the degree of oxidation/reduction of Fe or Redox [$Fe^{2+}/(Fe^{2+}+Fe^{3+})$] can be also suitably regulated.

Next, the refining step is a step of removing bubbles from the molten glass obtained in the aforementioned melting step. As the refining step, a method of degassing under reduced pressure may be applied. For producing the glass substrate according to the invention, $SO_3$ or $SnO_2$ can be used as a refining agent. Preferred $SO_3$ sources are the sulfates of at least one element selected from among Al, Mg, Ca, Sr, and Ba. More preferred are the sulfates of alkaline earth metals. Of those, $CaSO_4 \cdot 2H_2O$, $SrSO_4$, and $BaSO_4$ are especially preferred because of their conspicuous effect of enlarging bubbles.

As a refining agent for the method of degassing performed under reduced pressure, it is preferred to use a halogen such as Cl or F. Preferred Cl sources are the chlorides of at least one element selected from among Al, Mg, Ca, Sr, and Ba. More preferred are the chlorides of alkaline earth metals. Of those, $SrCl_2 \cdot 6H_2O$ and $BaCl_2 \cdot 2H_2O$ are especially preferred because of their conspicuous effect of enlarging bubbles and their low deliquescence. Preferred F sources are the fluorides of at least one element selected from among Al, Mg, Ca, Sr, and Ba. More preferred are the fluorides of alkaline earth metals. Of those, $CaF_2$ is preferred because of its conspicuous effect of enhancing the meltability of raw glass materials.

Next, the forming step is a step where the molten glass from which bubbles have been removed in the aforementioned refining step is formed into a plate-like shape to obtain a glass ribbon. A float process is applied to the forming step. In the float process, the molten glass is poured onto a molten metal to obtain a plate-shaped glass ribbon.

Next, the annealing step is a step where the glass ribbon obtained in the aforementioned forming step is gradually cooled down to a room temperature state. As the annealing step, the glass ribbon is gradually cooled down to the room temperature state so that an average cooling rate from a temperature at which the viscosity is $10^{13}$ dPa·s to a temperature at which the viscosity reaches $10^{14.5}$ dPa·s is R. The annealed glass ribbon is cut to obtain the glass substrate.

In the method for manufacturing the glass substrate according to one embodiment of the invention, the obtained glass substrate has the following composition, as represented by molar percentage based on oxides.

$SiO_2$: 50%-75%

$Al_2O_3$: 6%-16%

$B_2O_3$: 0%-15%

MgO: 0%-15%

CaO: 0%-13%

SrO: 0%-11%

BaO: 0%-9.5%

In the method for manufacturing the glass substrate according to one embodiment of the invention, the composition of the obtained glass substrate and the average cooling rate R (° C./min) in the annealing step from the temperature at which the viscosity of the glass ribbon is $10^{13}$ dPa·s to the temperature at which the viscosity reaches $10^{14.5}$ dPa·s satisfy the following conditions (1) to (4).

0.0177×(content of $SiO_2$)−0.0173×(content of $Al_2O_3$)+0.0377×(content of $B_2O_3$)+0.0771×(content of MgO)+0.1543×(content of CaO)+0.1808×(content of SrO)+0.2082×(content of BaO)+0.0344×($log_{10}R$) is 2.70–3.20;   Condition (1):

0.0181×(content of $SiO_2$)+0.0004×(content of $Al_2O_3$)+0.0387×(content of $B_2O_3$)+0.0913×(content of MgO)+0.1621×(content of CaO)+0.1900×(content of SrO)+0.2180×(content of BaO)+0.0391×($log_{10}R$) is 3.13–3.63;   Condition (2):

0.0177×(content of $SiO_2$)+0.0195×(content of $Al_2O_3$)+0.0323×(content of $B_2O_3$)+0.1015×(content of MgO)+0.1686×(content of CaO)+0.1990×(content of SrO)+0.2179×(content of BaO)+0.0312×($log_{10}R$) is 3.45–3.95; and   Condition (3):

0.0111×(content of $SiO_2$)+0.0250×(content of $Al_2O_3$)+0.0078×(content of $B_2O_3$)+0.0144×(content of MgO)+0.0053×(content of CaO)+0.0052×(content of SrO)+0.0013×(content of BaO)−0.0041×($log_{10}R$) is 1.10–1.30.   Condition (4):

Preferably the following conditions (1) to (4) are satisfied.

0.0177×(content of $SiO_2$)−0.0173×(content of $Al_2O_3$)±0.0377×(content of $B_2O_3$)+0.0771×(content of MgO)+0.1543×(content of CaO)+0.1808×(content of SrO)+0.2082×(content of BaO)+0.0344×($log_{10}R$) is 2.80–3.10;   Condition (1):

0.0181×(content of $SiO_2$)+0.0004×(content of $Al_2O_3$)+0.0387×(content of $B_2O_3$)+0.0913×(content of MgO)+0.1621×(content of CaO)+0.1900×(content of SrO)+0.2180×(content of BaO)+0.0391×($log_{10}R$) is 3.23–3.53;   Condition (2):

0.0177×(content of $SiO_2$)+0.0195×(content of $Al_2O_3$)+0.0323×(content of $B_2O_3$)+0.1015×(content of MgO)+0.1686×(content of CaO)+0.1990×(content of SrO)+0.2179×(content of BaO)+0.0312×($log_{10}R$) is 3.55–3.85; and   Condition (3):

0.0111×(content of $SiO_2$)+0.0250×(content of $Al_2O_3$)+0.0078×(content of $B_2O_3$)+0.0144×(content of MgO)+0.0053×(content of CaO)+0.0052×(content of SrO)+0.0013×(content of BaO)−0.0041×($log_{10}R$) is 1.24–1.27.   Condition (4):

Here, the content of $SiO_2$, the content of $Al_2O_3$, the content of $B_2O_3$, the content of MgO, the content of CaO, the content of SrO, and the content of BaO are contents of respective components contained in the obtained glass. When the glass substrate satisfies the conditions (1) to (4), it is possible to manufacture the glass substrate in which the residual strain generated in the silicon strain in the heat treatment step can be reduced.

The invention is not limited to the aforementioned embodiments. Modifications, improvements, etc. within the scope where the object of the invention can be attained are included in the invention.

For example, when the glass substrate according to one embodiment of the invention is manufactured, a fusion process, a press forming process, or the like, may be applied to the forming step to form molten glass into a plate-like shape.

In addition, when the glass substrate according to one embodiment of the invention is manufactured, a platinum crucible may be used. When the platinum crucible is used, the melting step is arranged as follows. That is, raw materials are prepared to have a composition of the glass substrate which should be obtained. The platinum crucible in which the raw materials have been put is thrown into an electric furnace, and preferably heated to about 1,450° C.-1,650° C. A platinum stirrer is inserted into the platinum crucible to stir the raw materials for 1 hour to 3 hours. Thus, molten glass is obtained.

In the forming step, the molten glass is, for example, poured onto a carbon plate, and formed into a plate-like shape. In the annealing step, the plate-like glass is gradually cooled down to a room temperature state, and cut to obtain a glass substrate.

In addition, the glass substrate obtained by cutting may be, for example, heated to about Tg+50° C., and then gradually cooled down to the room temperature state. In this manner, the equivalent cooling rate q can be adjusted.

The invention will be described specifically along its examples. However, the invention is not limited to the examples.

Various raw glass materials including silica sand were prepared so as to result in each of the glass compositions (target compositions) shown in Table 1. The raw materials were put into a platinum crucible, and heated at a temperature of 1,550° C.-1,650° C. for 3 hours in an electric furnace so as to be melted. Thus, molten glass was obtained. During the melting, a platinum stirrer was inserted into the platinum crucible to stir the raw materials for 1 hour to thereby homogenize the glass. The molten glass was poured onto a carbon plate, and formed into a plate-like shape. After that, the plate-like glass was put into the electric furnace at a temperature of about Tg+50° C. so that the temperature of the glass was decreased in the electric furnace at a cooling rate R (° C./min). Thus, the glass was cooled to reach the room temperature.

The obtained glass was evaluated as to values obtained from the following expressions (1) to (4), average coefficient of thermal expansion (ppm/° C.), compaction (ppm), BHF haze (%), Young's modulus (GPa), density (g/cm$^3$), strain temperature (° C.), transmittance (%), $T_2$ (° C.), $T_4$ (° C.), devitrification temperature (° C.), devitrification viscosity $\log_{10}\eta_{TL}$ (dPa·sec), and photoelastic constant [nm/(MPa·cm)]. Results obtained about seven examples are shown in Table 1. Table 1 also shows $\alpha_{200/300}/\alpha_{50/100}$, $|\Delta\alpha_{50/100}|$, $|\Delta\alpha_{100/200}|$, $|\Delta\alpha_{200/300}|$, and average cooling rate (° C./min).

0.0177×(content of SiO$_2$)−0.0173×(content of Al$_2$O$_3$)+0.0377×(content of B$_2$O$_3$)+0.0771× (content of MgO)+0.1543×(content of CaO)+ 0.1808×(content of SrO)+0.2082×(content of BaO)+0.0344×($\log_{10}q_{eq}$) is 2.70–3.20;  Expression (1):

0.0181×(content of SiO$_2$)+0.0004×(content of Al$_2$O$_3$)+0.0387×(content of B$_2$O$_3$)+0.0913× (content of MgO)+0.1621×(content of CaO)+ 0.1900×(content of SrO)+0.2180×(content of BaO)+0.0391×($\log_{10}q_{eq}$) is 3.13–3.63;  Expression (2):

0.0177×(content of SiO$_2$)+0.0195×(content of Al$_2$O$_3$)+0.0323×(content of B$_2$O$_3$)+0.1015× (content of MgO)+0.1686×(content of CaO)+ 0.1990×(content of SrO)+0.2179×(content of BaO)+0.0312×($\log_{10}q_{eq}$) is 3.45–3.95; and  Expression (3):

0.0111×(content of SiO$_2$)+0.0250×(content of Al$_2$O$_3$)+0.0078×(content of B$_2$O$_3$)+0.0144× (content of MgO)+0.0053×(content of CaO)+ 0.0052×(content of SrO)+0.0013×(content of BaO)−0.0041×($\log_{10}q_{eq}$) is 1.10–1.30.  Expression (4):

Values in parentheses in the table are calculated values.

Methods for measuring the respective physical properties will be shown below.

(Average Coefficient of Thermal Expansion)

The average coefficient of thermal expansion was measured by a differential dilatometer (TMA) in accordance with the method as provided for in JIS R3102 (year 1995). $\alpha_{50/100}$ was measured in a temperature range of 50° C.-100° C. $\alpha_{100/200}$ was measured in a temperature range of 100° C.-200° C. $\alpha_{200/300}$ was measured in a temperature range of 200° C.-300° C.

(Average Coefficient of Thermal Expansion of Silicon Substrate)

Table 2 shows an average coefficient of thermal expansion of a silicon substrate (manufactured by Shin-Etsu Chemical Co., Ltd.) made of single-crystal silicon. $\alpha_{Si50/100}$ of the silicon substrate was 2.94 ppm/° C. $\alpha_{Si100/200}$ of the silicon substrate was 3.37 ppm/° C. $\alpha_{Si200/300}$ of the silicon substrate was 3.69 ppm/° C. $\alpha_{Si200/300}/\alpha_{Si50/100}$ ion was 1.25. Typically the average coefficient of thermal expansion of the silicon substrate is a value shown in Table 2.

(Compaction)

The compaction was calculated based on measurement of an interval between indentations of each sample as described previously.

(BHF Haze)

As described previously, each sample was immersed in a solution in which 50% hydrofluoric acid and 40% ammonium fluoride aqueous solution had been mixed. After that, the BHF haze of the sample was measured by a haze meter manufactured by Suga Test Instruments Co., Ltd.

(HF Weight Reduction Ratio)

As described previously, a glass mirror-finished to be 40 mm square was immersed into a 5 mass % hydrofluoric acid aqueous solution at 25° C. for 20 minutes. A weight reduction amount was obtained from weights of the glass measured before and after the immersion. The weight reduction amount for 20 minutes was converted into an amount per one minute. Thus, a reduction amount per unit area and unit time ((mg/cm$^2$/min) was obtained.

(Young's Modulus)

A glass having a thickness of 0.5 mm-10 mm was measured for Young's modulus by an ultrasonic pulse method.

(Density)

Glass masses weighing about 20 g and containing no bubbles were measured by Archimedes' method to determine the density.

(Strain Temperature)

A strain temperature was measured in accordance with the method as provided for in JIS R3103-2 (year 2001).

(Transmittance)

A glass substrate having a thickness of 0.5 mm was measured for transmittance of light at a wavelength of 300 nm by a visible-ultraviolet spectrophotometer.

($T_2$)

A rotational viscometer was used to measure the viscosity to determine the temperature $T_2$ (° C.) at which the viscosity was $10^2$ dPa·s.

($T_4$)

The rotational viscometer was used to measure the viscosity to determine the temperature $T_4$ (° C.) at which the viscosity was $10^4$ dPa·s.

(Devitrification Temperature)

As for the devitrification temperature, pulverized glass particles were put in a platinum-made dish and heat-treated for 17 hours in an electric furnace controlled at a given temperature, and an average value between a maximum temperature causing precipitation of a crystal on the surface of the glass or inside the glass and a minimum temperature causing no precipitation of a crystal on the surface of the glass or inside the glass, which were determined by observation with an optical microscope after the heat treatment, was employed.

(Devitrification Viscosity)

The rotational viscometer was used to measure the viscosity of molten glass at a high temperature (1,000° C.-1,600° C.). From the measured result, constants of Fulcher's equation were obtained. The devitrification viscosity was obtained by the Fulcher's equation using the obtained constants.

(Photoelastic Constant)

A measurement was made by a disk compression method ("Measurement of Photoelastic Constant of Chemically Strengthened Glass by Disk Compression Method" by Ryosuke Yokota, Yōgyō Kyōkai-shi, Vol. 87[10] (1979), p. 519-522).

Examples 1 to 3 in Table 1 are examples of the invention, and Examples 4 to 7 are comparative examples. In an alkali-free glass substrate in each of Examples 1 to 3, the compaction is 100 ppm or less. Accordingly, pattern deviation hardly occurs. In addition, the values $|\Delta\alpha_{50/100}|$, $|\Delta\alpha_{100/200}|$ and $|\Delta\alpha_{200/300}|$ are 0.16 ppm/° C. or less. Accordingly, the residual strain generated in the silicon substrate tends to decrease in the heat treatment step where the silicon substrate and the glass substrate are laminated to each other.

In a glass substrate in each of Examples 4, 5 and 7, the compaction is out of the range as to the glass substrate according to one of the embodiments of the invention. Accordingly, pattern deviation tends to occur. In addition, in a glass substrate in each of Examples 4 to 7, the values $|\Delta\alpha_{50/100}|$, $|\Delta\alpha_{100/200}|$ and $|\Delta\alpha_{200/300}|$ are out of the ranges as to the glass substrate according to one of the embodiments of the invention. Accordingly, the residual strain generated in the silicon substrate tends to increases in the heat treatment step where the silicon substrate and the glass substrate are laminated to each other.

TABLE 1

| | | 1 | 2 | 3 | 4 | 5 | 6 | 7 |
|---|---|---|---|---|---|---|---|---|
| Composition (mol %) | $SiO_2$ | 66.8 | 66.8 | 65.6 | 69.6 | 66.1 | 67.1 | 68.0 |
| | $Al_2O_3$ | 13.0 | 13.0 | 12.5 | 12.8 | 11.2 | 12.8 | 11.1 |
| | $B_2O_3$ | 4.6 | 4.6 | 9.7 | 5.9 | 7.4 | 1.2 | 9.1 |
| | MgO | 8.0 | 8.0 | 4.4 | 1.3 | 5.4 | 9.1 | 2.4 |
| | CaO | 6.6 | 6.6 | 2.0 | 8.3 | 4.9 | 5.4 | 8.7 |
| | SrO | 1.0 | 1.0 | 5.8 | 1.4 | 4.9 | 4.4 | 0.6 |
| | BaO | 0.0 | 0.0 | 0.0 | 0.7 | 0.0 | 0.0 | 0.0 |
| | $Fe_2O_3$ | 0.004 | 0.004 | 0.004 | 0.004 | 0.020 | 0.020 | 0.004 |
| | $Na_2O$ | 0.02 | 0.02 | 0.02 | 0.02 | 0.07 | 0.02 | 0.02 |
| | $SnO_2$ | 0.0 | 0.0 | 0.0 | 0.1 | 0.0 | 0.0 | 0.1 |
| CTE (ppm/° C.) | $\alpha_{50/100}$ | 2.97 | 2.91 | 3.06 | 3.19 | 3.38 | 3.35 | 3.12 |
| | $\alpha_{100/200}$ | 3.44 | 3.38 | 3.36 | 3.50 | 3.75 | 3.82 | 3.45 |
| | $\alpha_{200/300}$ | 3.74 | 3.69 | 3.61 | 3.75 | 4.02 | 4.19 | 3.68 |
| | $(\alpha_{200/300})/(\alpha_{50/100})$ | 1.26 | 1.27 | 1.18 | 1.18 | 1.19 | 1.25 | 1.18 |
| ΔCTE (ppm/° C.) | $\Delta\alpha_{50/100}$ | 0.03 | −0.03 | 0.12 | 0.25 | 0.44 | 0.41 | 0.17 |
| | $\Delta\alpha_{100/200}$ | 0.07 | 0.01 | −0.01 | 0.13 | 0.38 | 0.45 | 0.08 |
| | $\Delta\alpha_{200/300}$ | 0.05 | 0.00 | −0.08 | 0.06 | 0.33 | 0.50 | −0.01 |
| | $\Delta\alpha_{Max}$ | 0.07 | 0.03 | 0.12 | 0.25 | 0.44 | 0.50 | 0.17 |
| | Expression (1) | 3.00 | 2.95 | 3.01 | 3.10 | 3.37 | 3.40 | 3.08 |
| | Expression (2) | 3.44 | 3.38 | 3.39 | 3.48 | 3.78 | 3.87 | 3.44 |
| | Expression (3) | 3.76 | 3.71 | 3.65 | 3.71 | 4.04 | 4.24 | 3.63 |
| | Expression (4) | 1.25 | 1.26 | 1.22 | 1.20 | 1.20 | 1.25 | 1.18 |
| | Compaction (ppm) | 53 | 1 | 17 | 120 | 120 | 44 | 340 |
| | BHF haze (%) | 15 | 15 | (<1) | 0.3 | 1 | 48 | 1 |
| | HF etching rate (($mg/cm^2$)/min) | 0.13 | 0.13 | (0.13) | 0.13 | 0.16 | 0.17 | 0.14 |
| | Young's modulus (GPa) | 84 | 84 | 75 | 77 | 76 | 85 | 73 |
| | Density (g/$cm^3$) | 2.47 | 2.47 | 2.48 | 2.47 | 2.52 | 2.59 | 2.4 |
| | Strain temperature (° C.) | 711 | 711 | 672 | 703 | 670 | 716 | 667 |
| | Transmittance (%) @300 nm (0.5 mmt) | 75 | 75 | 75 | 70 | 50 | 50 | 75 |
| | T2 (° C.) | 1647 | 1647 | 1647 | (1720) | 1645 | 1654 | 1692 |
| | T4 (° C.) | 1295 | 1295 | 1284 | (1330) | 1275 | 1298 | 1296 |
| | Devitrification temperature (° C.) | 1305 | 1305 | 1295 | — | 1270 | 1285 | — |
| | Devitrification viscosity | 3.9 | 3.9 | 4.0 | — | 4.1 | 4.1 | — |
| | Photoelastic constant (nm/cm/MPa) | 29 | 29 | 32 | 30 | 31 | 27 | 34 |
| | Average cooling rate R (° C./min) | 40 | 1 | 1 | 230 | 40 | 40 | 680 |
| | Evaluation | ○ | ○ | ○ | X | X | X | X |

TABLE 2

| | silicon substrate |
|---|---|
| $\alpha_{Si50/100}$ | 2.94 ppm/° C. |
| $\alpha_{Si100/200}$ | 3.37 ppm/° C. |
| $\alpha_{Si200/300}$ | 3.69 ppm/° C. |
| $\alpha_{Si200/300}/\alpha_{Si50/100}$ | 1.25 |

The present application is based on Japanese Patent Application No. 2016-154682 filed on Aug. 5, 2016, the contents of which are incorporated herein by reference.

The invention is not limited to the aforementioned embodiments, but deformations, improvements, etc. can be made suitably. In addition, materials, shapes, dimensions, values, forms, numbers, arrangement places, etc. of respective constituent elements in the aforementioned embodiments are not limited. Any materials, any shapes, any dimensions, any values, any foal's, any numbers, any arrangement places, etc. may be used as long as the invention can be attained.

INDUSTRIAL APPLICABILITY

According to one embodiment of the invention, it is possible to provide a glass substrate suitable for manufacturing a small-size and high-definition display device. In addition, it is possible to provide a semiconductor device and a display device using the glass substrate.

According to one embodiment of the invention, it is possible to provide a glass substrate suitable for manufacturing a display device provided with a transparent image display element or a reflection display element, as a high-definition display device. Examples of such display devices may include liquid crystal display devices (LCDs), transparent liquid crystal display devices, LCOSs (Liquid Crystals On Silicon), MEMSs (Micro Electro Mechanical Systems such as digital mirror devices), etc.

According to one embodiment of the invention, it is possible to provide a glass substrate suitable for manufacturing a display device provided with a self-luminous display element using electroluminescence, as another display device. Examples of such display devices may include organic EL display devices, inorganic EL display devices, micro LEDs, etc.

Further, according to an embodiment of the invention, it is possible to provide a glass substrate suitable for manufacturing a display device such as a head mounted display or a projector.

Moreover, according to an embodiment of the invention, it is possible to provide a glass substrate suitable for manufacturing a display device provided with a display element having a pixel density (image resolution) of 1,000 ppi or higher in an element surface of the display element, as a high-definition display device.

DESCRIPTION OF REFERENCE NUMERALS AND SIGNS

10: silicon substrate
20: bonding layer
30: thin film transistor
40: display element
50: laminated substrate
52: semiconductor device
54: display device

The invention claimed is:

1. A glass substrate having a compaction of 0.1 to 100 ppm, and having the following composition, as represented by molar percentage based on oxides:
$SiO_2$: 50% to 75%,
$Al_2O_3$: 6% to 16%,
$B_2O_3$: 4% to 15%,
MgO: 0% to 15%,
CaO: 0% to 13%,
SrO: 0% to 11%, and
BaO: 0% to 9.5%,
wherein the composition of the glass substrate satisfies:
0.0177×(content of $SiO_2$)−0.0173×(content of $Al_2O_3$)+ 0.0377×(content of $B_2O_3$)+0.0771×(content of MgO)+ 0.1543×(content of CaO)+0.1808×(content of SrO)+ 0.2082×(content of BaO)+0.0344×($\log_{10}q_{eq}$) is 2.70 to 3.20;
0.0181×(content of $SiO_2$)+0.0004×(content of $Al_2O_3$)+ 0.0387×(content of $B_2O_3$)+0.0913×(content of MgO)+ 0.1621×(content of CaO)+0.1900×(content of SrO)+ 0.2180×(content of BaO)+0.0391×($\log_{10}q_{eq}$) is 3.13 to 3.63;
0.0177×(content of $SiO_2$)+0.0195×(content of $Al_2O_3$)+ 0.0323×(content of $B_2O_3$)+0.1015×(content of MgO)+ 0.1686×(content of CaO)+0.1990×(content of SrO)+ 0.2179×(content of BaO)+0.0312×($\log_{10}q_{eq}$) is 3.45 to 3.95; and
0.0111×(content of $SiO_2$)+0.0250×(content of $Al_2O_3$)+ 0.0078×(content of $B_2O_3$)+0.0144×(content of MgO)+ 0.0053×(content of CaO)+0.0052×(content of SrO)+ 0.0013×(content of BaO)−0.0041×($\log_{10}q_{eq}$) is 1.10 to 1.30,
where the content of $SiO_2$, the content of $Al_2O_3$, the content of $B_2O_3$, the content of MgO, the content of CaO, the content of SrO, and the content of BaO are contents of respective components contained in the glass substrate as represented by molar percentage based on oxides, and $q_{eq}$ is an equivalent cooling rate (unit: ° C./min), and
wherein an absolute value $|\Delta\alpha_{50/100}|$ of a difference between an average coefficient of thermal expansion $\alpha_{50/100}$ of the glass substrate and an average coefficient of thermal expansion of single-crystal silicon at 50° C. to 100° C., an absolute value $|\Delta\alpha_{100/200}|$ of a difference between an average coefficient of thermal expansion $\alpha_{100/200}$ of the glass substrate and an average coefficient of thermal expansion of the single-crystal silicon at 100° C. to 200° C., and an absolute value $|\Delta\alpha_{200/300}|$ of a difference between an average coefficient of thermal expansion $\alpha_{200/300}$ of the glass substrate and an average coefficient of thermal expansion of the single-crystal silicon at 200° C. to 300° C. are 0.16 ppm/° C. or less.

2. The glass substrate according to claim 1, wherein the content of $B_2O_3$, as represented by molar percentage based on oxides, is 9.7% to 15%.

3. The substrate according to claim 1, having a total content of $Li_2O$, $Na_2O$, and $K_2O$ of 0% to 0.1%.

4. The substrate according to claim 3, wherein the content of $Al_2O_3$ is 11% to 16%.

5. The substrate according to claim 4, wherein the content of CaO is 0% to 8%.

6. The glass substrate according to claim 1, wherein the composition of the glass substrate satisfies:
0.0177×(content of $SiO_2$)−0.0173×(content of $Al_2O_3$)+ 0.0377×(content of $B_2O_3$)+0.0771×(content of MgO)+ 0.1543×(content of CaO)+0.1808×(content of SrO)+ 0.2082×(content of BaO)+0.0344×($\log_{10}q_{eq}$) is 2.80 to 3.10;
0.0181×(content of $SiO_2$)+0.0004×(content of $Al_2O_3$)+ 0.0387×(content of $B_2O_3$)+0.0913×(content of MgO)+ 0.1621×(content of CaO)+0.1900×(content of SrO)+ 0.2180×(content of BaO)+0.0391×($\log_{10}q_{eq}$) is 3.23 to 3.53;
0.0177×(content of $SiO_2$)+0.0195×(content of $Al_2O_3$)+ 0.0323×(content of $B_2O_3$)+0.1015×(content of MgO)+ 0.1686×(content of CaO)+0.1990×(content of SrO)+ 0.2179×(content of BaO)+0.0312×($\log_{10}q_N$) is 3.55 to 3.85; and
0.0111×(content of $SiO_2$)+0.0250×(content of $Al_2O_3$)+ 0.0078×(content of $B_2O_3$)+0.0144×(content of MgO)+ 0.0053×(content of CaO)+0.0052×(content of SrO)+ 0.0013×(content of BaO)−0.0041×($\log_{10}q_{eq}$) is 1.20 to 1.27.

7. The glass substrate according to claim 1, having a total content of CaO, SrO, and BaO of 5% or higher, satisfying a relation of (content of $Al_2O_3$)≥(content of MgO), and having a devitrification viscosity of $10^{3.8}$ dPa·s or higher.

8. The glass substrate according to claim 1, wherein the average coefficient of thermal expansion $\alpha_{50/100}$ at 50° C. to 100° C. is from 2.70 ppm/° C. to 3.20 ppm/° C.

9. The glass substrate according to claim 1, wherein the average coefficient of thermal expansion $\alpha_{100/200}$ at 100° C. to 200° C. is from 3.13 ppm/° C. to 3.63 ppm/° C.

10. The glass substrate according to claim 1, wherein the average coefficient of thermal expansion $\alpha_{200/300}$ at 200° C. to 300° C. is from 3.45 ppm/° C. to 3.95 ppm/° C.

11. The glass substrate according to claim 1, wherein the average coefficient of thermal expansion $\alpha_{200/300}$ at 200° C. to 300° C. is from 3.55 ppm/° C. to 3.85 ppm/° C.

12. The glass substrate according to claim 1, having a value $\alpha_{200/300}/\alpha_{50/100}$ obtained by dividing the average coefficient of thermal expansion $\alpha_{200/300}$ at 200° C. to 300° C. by the average coefficient of thermal expansion $\alpha_{50/100}$ at 50° C. to 100° C. of from 1.10 to 1.30.

13. The glass substrate according to claim 1, which shows a reduction amount ((mg/cm$^2$)/min) per unit area and unit time when the glass substrate is immersed in a 5 mass % hydrofluoric acid aqueous solution at 25° C. of 0.07 (m/cm$^2$)/min or higher and 0.18 (mg/cm$^2$)/min or less.

14. The glass substrate according to claim 1, having a BHF haze of 40% or less.

15. The glass substrate according to claim 1, having a photoelastic constant of 33 nm/(MPa·cm) or less.

16. The glass substrate according to claim 1, having
a BHF haze of 20% or less, and
a photoelastic constant of 33 nm/(MPa·cm) or less,
which shows a reduction amount ((mg/cm$^2$)/min) per unit area and unit time when the glass substrate is immersed in a 5 mass % hydrofluoric acid water solution at 25° C. of 0.07 (mg/cm$^2$)/min or more and 0.18 (mg/cm$^2$)/min or less.

17. A semiconductor device comprising the glass substrate according to claim 1, and a thin film transistor having a crystalline silicon film formed on the glass substrate.

18. The semiconductor device according to claim 17, wherein the crystalline silicon film is a single-crystal silicon film.

19. A display device comprising the semiconductor device according to claim 17 and a display element.

20. The display device according to claim 19, wherein the display element is a transparent image display element or a reflection image display element.

21. The display device according to claim 19, wherein the display element is a self-luminous display element using electroluminescence.

22. The display device according to claim 19, which is a head mounted display or a projector.

23. The display device according to claim 19, having a pixel density (image resolution) in an element surface of the display element of 1,000 ppi or higher.

* * * * *